United States Patent [19]
Kim

[11] Patent Number: 5,873,948
[45] Date of Patent: Feb. 23, 1999

[54] METHOD FOR REMOVING ETCH RESIDUE MATERIAL

[75] Inventor: Jae-Jeong Kim, Chungcheongbuk-do, Rep. of Korea

[73] Assignee: LG Semicon Co., Ltd., Chungcheong-Buk-Do, Rep. of Korea

[21] Appl. No.: 882,096

[22] Filed: Jun. 24, 1997

Related U.S. Application Data

[63] Continuation of Ser. No. 486,020, Jun. 7, 1995, abandoned.

[30] Foreign Application Priority Data

Jun. 7, 1994 [KR] Rep. of Korea ................. 1994-12720

[51] Int. Cl.⁶ ..................................................... B08B 5/00
[52] U.S. Cl. .............................. 134/19; 134/1.2; 134/1.3; 134/2; 134/7; 134/31; 134/38; 156/646.1
[58] Field of Search .......................... 156/646.1; 134/1.2, 134/1.3, 2, 31, 38, 7, 19

[56] References Cited

U.S. PATENT DOCUMENTS

| | | | |
|---|---|---|---|
| 4,581,101 | 4/1986 | Senoue et al. | 156/643 |
| 4,897,154 | 1/1990 | Chakravarti et al. | 134/1 |
| 4,944,837 | 7/1990 | Nishikawa et al. | 156/646 |
| 5,007,983 | 4/1991 | Lerner et al. | 156/643 |
| 5,013,366 | 5/1991 | Jackson et al. | 134/1 |
| 5,068,040 | 11/1991 | Jackson | 134/31 |
| 5,201,960 | 4/1993 | Starov | 134/11 |
| 5,213,919 | 5/1993 | Jackson et al. | 134/1 |
| 5,228,950 | 7/1993 | Webb et al. | 156/643 |
| 5,282,925 | 2/1994 | Jeng et al. | 134/31 |
| 5,306,350 | 4/1994 | Hoy et al. | 134/22.14 |
| 5,316,591 | 5/1994 | Chao et al. | 134/34 |
| 5,339,844 | 8/1994 | Stanford, Jr. et al. | 134/107 |
| 5,356,478 | 10/1994 | Chen et al. | 134/1 |
| 5,393,712 | 2/1995 | Rostoker et al. | 437/238 |
| 5,456,759 | 10/1995 | Stanford, Jr. et al. | 134/10 |
| 5,476,975 | 12/1995 | Ruddick et al. | 568/762 |
| 5,494,521 | 2/1996 | Paramjpe | 134/31 |
| 5,501,761 | 3/1996 | Evans et al. | 134/1.2 |
| 5,522,938 | 6/1996 | O'Brien | 134/1 |

*Primary Examiner*—Jill Warden
*Assistant Examiner*—S. Carrillo
*Attorney, Agent, or Firm*—Loudermilk and Associates

[57] ABSTRACT

A method for removing etch residue material in which the removing process is simple, and the metal is prevented from being corroded or damaged. The method for removing etch residue materials and photoresist after carrying out a dry etching includes the steps of preparing a dry chemical by using one or more gas compounds, and removing the etch residue materials by raising the dry chemical above a critical point, wherein the dry chemical comprises carbon dioxide gas and one or more gases selected from a group consisting of DMSO (dimethyl sulfoxide), DMFA (dimethyl formamide), and THF (phentydrone).

16 Claims, 1 Drawing Sheet

METHOD FOR REMOVING ETCH RESIDUE MATERIAL

This application is a continuation of application Ser. No. 08/486,020 filed on Jun. 7, 1995, now abandoned.

FIELD OF THE INVENTION

The present invention relates to methods for removing residue materials during semiconductor manufacturing processes, and more particularly to a method for removing etch residue material which is suitable for removing residue byproducts and unnecessary photoresist after a dry etch process.

BACKGROUND OF THE INVENTION

Dry etches are frequently used during semiconductor manufacturing processes. When a dry etch is to be carried out, the etching method and the method for removing the etch residue material have to be properly selected in accordance with the object to be etched. A conventional dry etching method is constituted as follows.

First, in the case where the object to be etched is a metal, the etch residue material is converted into a volatile material after etching, so that the etch residue material can be removed in the form of a gas.

That is, the etch residue material, which is formed by reaction between the etched material and the etch chemistry, is removed via a gaseous state. The etch chemistry is selected in such a manner that the etch residue material should have an increased volatility at the etching temperature, whereby the etch residue material becomes a compound which can be removed in a gaseous state.

For example, in the case where Al is to be etched by using $F_2$ gas, a reaction occurs may be illustrated as follows.

$Al+3F \rightarrow AlF_3$.

However, $AlF_3$ is not volatile at a normal temperature, but becomes volatile at a temperature of over 200° C. Therefore it is not used.

If chlorine $Cl_2$ gas is used as the etching chemistry, there is formed $AlCl_3$, which is highly volatile at a normal temperature, and therefore, this material is widely used. The reaction may be illustrated as follows.

$Al+3/2Cl_2 \rightarrow AlCl_3 (\uparrow)$

Therefore, when Al is etched, a chemistry of $Cl_2$ gas typically is used. If this method is used, however, an etch residue material is formed simultaneously with the formation of $AlCl_3$. Accordingly, there is required an additional process for removing the etch residue material. Due to the properties of the metal, an acid cannot be used for removing the etch residue material, and it has been difficult to remove the residue material.

Further, in the case where the etched material is silicon oxide, the used chemistry typically is $CF_4$ or $CHF_3$, and with this chemistry, a dry etching is carried out. In this case, an example reaction may occur as illustrated as follows:

$SiO_2+CF_4 \rightarrow SiF_4+CO_2 (\uparrow)$

Based on the above illustrative reaction, $SiF_4$ is formed, but other materials including etch residue materials such as CF, $CF_2$ and $CF_3$ also tend to form, and, therefore, a process for removing etch residue material also has to be carried out.

As for methods of removing etch residue materials formed after an etching process, there are dry chemical methods and wet chemical methods.

A dry chemical method is that in which a dry chemical of a plasma state is used to remove the etch residue materials including C and F. With such a method, the etch residue materials and the dry chemical of a plasma state directly react to form a highly volatile material, thereby removing the etch residue materials. Alternatively, a lift-off method in which the silicon of a lower layer under the residue material is etched, thereby removing the etch residue material utilizing a lift-off phenomenon.

The reaction in such cases may be illustrated as follows.

Residue materials containing C and $F+O_2$ plasma$\rightarrow COF$, CO, $CO_2$.

Residue material/lower layer $Si+HBr/Cl_2$ plasma$\rightarrow$residue material/($SiBr_4$, $SiCl_4$).

In the wet chemical method for removing the etch residue materials, a U cleaning+a D cleaning may be applied, in which a sulfuric acid chemical, a developer (containing amine as the main ingredient) and hydrogen peroxide are used, thereby removing polymers of a large molecular size. In the case where the lower layer consists of an oxide film, HF or a BOE (buffered oxide etchant) may be used. The U cleaning may use a solution in which $NH_4OH$, $H_2O_2$ and $H_2O$ are mixed at a ratio of 1:2:10, or 1:1:5, while the D cleaning may use a solution in which HCl, $H_2O_2$ and $H_2O$ are mixed at a ratio of 1:1:5. In both the U cleaning and the D cleaning, a cleaning is carried out, for example, at 10 minutes at a temperature of 80° C. The reactions for removing residue materials by using a wet chemical method may be illustrated as follows.

Polymer+$O_3/H_2SO_4 \rightarrow CO_2$

Polymer+$H_2O_2/H_2SO_4 \rightarrow CO_2$

Residue materials/lower layer $SiO_2 \rightarrow$residue materials/$Si_2F_6H_2$

Residue materials/lower layer $SiO_2$+BOE$\rightarrow$residue materials/$Si_2F_6H_2$ In conventional methods as described above, if a polymer of a large molecular size is to be removed, there typically is required a composite process consisting of an oxygen plasma+U cleaning+D cleaning, or $O_3/H_2SO_4$+U cleaning+D cleaning.

Further in the case where a polymer is disposed upon a metal, if the general acid or the U cleaning is applied, the metal is corroded, and, therefore, basically developers have been used. However, defects due to the metal corrosion tend to remain as before.

SUMMARY OF THE INVENTION

The present invention is intended to overcome the above described disadvantages of the conventional techniques.

Therefore it is an object of the present invention to provide a method for removing an etch residue material, in which the removing process is simple, and the metal is prevented from being corroded or damaged.

In the present invention, there is used one or more gases such as carbon dioxide in which the absorption coefficient is greatly increased towards infinity at above the critical point.

According to present invention, a method for removing an etch residue material is provided, in which the removing process is simple, and the metal in the wafer is inhibited from being corroded or damaged. The method for removing etch residue materials and photoresist after carrying out a dry etching includes the steps of preparing a dry chemical by using one or more gas compounds, and removing the etch residue materials by raising the dry chemical to above a critical point.

Carbon dioxide may be used for the gas compound. The gas compound also may contain carbon dioxide and one or more of gases selected from the group consisting of methyl alcohol, DMSO, DMFA, THF and oxygen.

DESCRIPTION OF THE PREFERRED EMBODIMENTS

Figure 1:
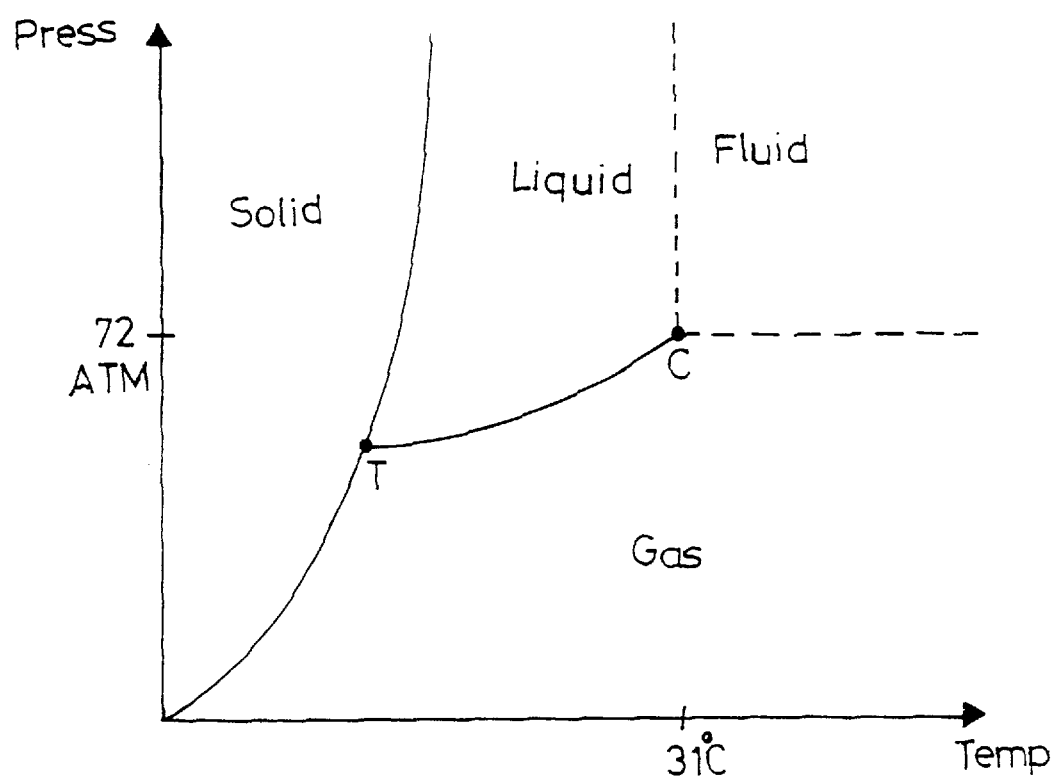
FIG. 1 is a temperature/pressure curve for purposes of illustrating how to present invention utilizes a gas above its critical point.

In the present invention, a dry chemical is used to remove etch residue materials containing C (carbon) and F (fluorine) such as CF, $CF_2$ and $CF_3$.

Generally, the etchant used as the dry chemical has a property such that the amount of polymer dissolved at the normal temperature and pressure is negligibly small. Therefore it is used with a plasma state. However, a gas like carbon dioxide can be made to have an infinite absorption coefficient by adjusting the temperature and pressure to above the critical point.

The critical point of carbon dioxide is about 31° C. and 72.9 atm, as illustrated in FIG. 1. The X axis indicates temperature and the Y axis indicates pressure. As illustrated in FIG. 1, over the critical point, the absorption coefficient becomes a maximum. The absorption coefficient is a ratio of an etch residue material containing C and/or F:$CO_2$ in a state over the critical point.

In the present invention, such a gas is used to remove polymers during a semiconductor manufacturing process. That is, the amount of the polymers dissolved into the gas at the normal temperature and pressure is a negligibly small (i.e., a first rate of dissolution). However, if this gas is raised to above the critical point (i.e., to a second temperature and second pressure above the critical point), the absorption coefficient greatly increases (i.e., dissolves at much greater second rate), until it has the about the same absorption capability as that of wet chemicals.

According to one embodiment of the present invention, carbon dioxide is injected into a chamber in which a semiconductor wafer is placed. The carbon dioxide atmosphere is raised above the critical point, i.e., to above about 31° C. and 72.9 atm, thereby removing the residue materials remaining on the wafer.

According to another embodiment of the present invention, a main gas compound such as carbon dioxide and an auxiliary gas compound are used. The auxiliary gas compound is selected from a group consisting of methyl alcohol, DMSO ($C_2H_6OS$:Dimethyl Sulfoxide), DMFA ($C_3H_7NO$—N:Dimethyl formamide), THF ($C_{13}H_{12}O$):Phentydrone), oxygen and the like.

When the etch residue material removing method according to the present invention is applied, the removed etch residue material level after a metallization process can be maintained comparable to that of a wet chemical method, while the corrosion of metal can be prevented. Consequently, crack defect (CD) loss can be avoided.

Further, the method of the present invention can be applied to removing photoresist.

According to the present invention, the conventional complicated process may be simplified and improved.

Although various preferred embodiments of the present invention have been disclosed for illustrative purposes, those skilled in the art will appreciate that various modifications, additions and/or substitutions are possible without departing from the scope and spirit of the present invention as disclosed in the claims. In addition, various chemical formulas have been disclosed for illustrative purposes, although Applicant in no way intends to be bound by any specific theory or formula.

What is claimed is:

1. A method for removing residue materials comprising carbon or fluorine-containing polymers from a substrate, the method comprising the steps of:

etching a layer on the substrate, wherein the carbon or fluorine-containing polymers are formed on the substrate as by-products of the etching step;

introducing a dry chemical to the substrate at a first temperature and first pressure, wherein the dry chemical dissolves the carbon or fluorine-containing polymers at a first rate at the first temperature and first pressure, wherein the dry chemical comprises carbon dioxide gas and one or more gases selected from the group consisting of DMSO (dimethyl sulfoxide), DMFA (dimethyl formamide), and THF (phentydrone); and raising the dry chemical to a second temperature and second pressure, wherein the second temperature and second pressure are above a critical point for the dry chemical, wherein the dry chemical dissolves the carbon or fluorine-containing polymers at a second rate at the second temperature and second pressure, wherein the second rate is greater than the first rate, and wherein the residue materials comprising carbon or fluorine-containing polymers are removed from the substrate.

2. The method of claim 1, wherein the substrate comprises a semiconductor substrate, wherein the residue materials are by-products of a dry etching process.

3. The method of claim 1, wherein the second temperature and second pressure are above 31° C. and 72.9 atmospheres.

4. The method of claim 2, wherein the residue materials comprise compounds selected from the group consisting of CF, $CF_2$ and $CF_3$.

5. A method for removing residue materials comprising carbon or fluorine-containing polymers from a substrate, the method comprising the steps of:

etching a layer on the substrate, wherein the carbon or fluorine-containing polymers are formed on the substrate as by-products of the etching step;

introducing a dry chemical to the substrate, wherein the dry chemical comprises carbon dioxide gas and one or more gases selected from the group consisting of DMSO dimethyl sulfoxide), DMFA (dimethyl formamide), and THF (phentydrone); and controlling a temperature and pressure of the dry chemical so that one or more of the gases of the dry chemical is above a critical point of the dry chemical, wherein the carbon or fluorine-containing polymers are removed from the substrate.

6. The method of claim 5, wherein one of the gases of the dry chemical has an absorption coefficient for the carbon or fluorine-containing polymers above the critical point that is greater than an absorption coefficient for the carbon or fluorine-containing polymers below the critical point.

7. The method of claim 5, wherein the residue materials further comprises photoresist.

8. The method of claim 5, wherein the substrate comprises a semiconductor substrate.

9. The method of claim 8, wherein the etching step comprises dry etching a layer on the semiconductor substrate, wherein residue materials are produced on the semiconductor substrate as a result of the dry etching step.

10. The method of claim 8, wherein the residue materials further comprises photoresist.

11. A method of removing residue materials containing carbon or fluorine polymers from a substrate in a chamber, the method comprising the steps of:

etching a layer on the substrate, wherein the residue materials containing carbon or fluorine-containing polymers are formed on the substrate as by-products of the etching step;

injecting a gas comprising carbon dioxide and one or more gases selected from the group consisting of DMSO (dimethyl sulfoxide), DMFA (dimethyl formamide), and THF (phentydrone) into the chamber; and controlling a temperature and pressure of the carbon dioxide gas in the chamber to above about 31° C. and about 72.9 atmospheres, wherein the residue materials containing carbon or fluorine-containing polymers are removed from the substrate.

12. The method of claim 11, wherein the substrate comprises a semiconductor substrate, wherein the residue materials are by-products of a dry etching process.

13. The method of claim 11, wherein the residue materials comprise compounds selected from the group consisting of $CF$, $CF_2$, and $CF_3$.

14. The method of claim 11, wherein the residue materials further comprises photoresist.

15. The method of claim 11, wherein the substrate comprises a semiconductor substrate.

16. The method of claim 12, wherein the etching step comprises dry etching a layer on the semiconductor substrate, wherein the residue materials result as a by-product of the dry etch process.

* * * * *